United States Patent
Chou et al.

(10) Patent No.: US 10,062,442 B2
(45) Date of Patent: Aug. 28, 2018

(54) METHOD FOR MANAGING DATA BLOCKS AND METHOD OF DATA MANAGEMENT FOR DATA STORAGE DEVICE

(71) Applicant: Silicon Motion, Inc., Jhubei, Hsinchu (TW)

(72) Inventors: Po-Sheng Chou, Hsinchu (TW); Huan-Jung Yeh, Kaohsiung (TW)

(73) Assignee: SILICON MOTION, INC., Jhubei (TW)

( * ) Notice: Subject to any disclaimer, the term of this patent is extended or adjusted under 35 U.S.C. 154(b) by 0 days.

(21) Appl. No.: 15/472,221

(22) Filed: Mar. 28, 2017

(65) Prior Publication Data

US 2017/0329542 A1    Nov. 16, 2017

(30) Foreign Application Priority Data

May 13, 2016   (TW) .............................. 105114892 A

(51) Int. Cl.
  *G11C 16/34*  (2006.01)
  *G06F 3/06*   (2006.01)
  *G11C 16/16*  (2006.01)

(52) U.S. Cl.
  CPC .......... *G11C 16/3495* (2013.01); *G06F 3/064* (2013.01); *G06F 3/0619* (2013.01); *G06F 3/0652* (2013.01); *G06F 3/0653* (2013.01); *G06F 3/0679* (2013.01); *G11C 16/16* (2013.01)

(58) Field of Classification Search
  CPC ... G11C 16/16; G11C 16/3495; G06F 3/0619; G06F 3/064; G06F 3/0652; G06F 3/0653; G06F 3/0679
  See application file for complete search history.

(56) References Cited

U.S. PATENT DOCUMENTS

| | | | |
|---|---|---|---|
| 8,332,576 B2 | 12/2012 | Chu et al. | |
| 2008/0259708 A1* | 10/2008 | Tsukazaki | G11C 16/3418 365/222 |
| 2010/0100663 A1 | 4/2010 | Kao et al. | |
| 2014/0293696 A1 | 10/2014 | Lin et al. | |
| 2015/0339188 A1 | 11/2015 | Hu et al. | |

OTHER PUBLICATIONS

Office Action issued by Taiwan Intellectual Property Office dated May 11, 2017.

* cited by examiner

*Primary Examiner* — Harry W Byrne
*Assistant Examiner* — R Lance Reidlinger
(74) *Attorney, Agent, or Firm* — Chieh-Mei Wang

(57) ABSTRACT

A method for managing a plurality of data blocks of a data storage device includes steps of: reading a plurality of data pages in the data blocks which having valid data; updating a plurality of access counts of the data pages in the data blocks; determining whether an access count of the data block is greater than or equal to an access count threshold, wherein the access count of the data block is selected from one of the access counts of the data pages therein; and when the determination is positive, storing data in the data block into a spare data block of the data blocks. The access count threshold is updated when an erase count of the data block is determined to be greater than or equal to an erase count threshold. A method of data management for a data storage device is also provided.

13 Claims, 4 Drawing Sheets

| 231a | 231a | 1 |
|---|---|---|
| 232a | 232a | 3 |
| 233a | 233a | 9 |
| 234a | 234a | 2 |
| 235a | 235a | 7 |

231 — (231a row) — 231b
232 — (232a row) — 232b
233 — (233a row) — 233b
234 — (234a row) — 234b
235 — (235a row) — 235b

METHOD FOR MANAGING DATA BLOCKS AND METHOD OF DATA MANAGEMENT FOR DATA STORAGE DEVICE

FIELD OF THE INVENTION

The present invention relates to a method for managing data blocks, and more particularly to a method for managing data blocks capable of reducing data damage.

BACKGROUND OF THE INVENTION

Non-volatile memory is an electronic memory device with specific capabilities such as maintaining data without additional power, fast data access and shockproof. Therefore, non-volatile memory is extensively used in memory cards, solid state drives (SSD) and portable multimedia devices. Non-volatile memory includes a plurality of data blocks for storing data. A data block may have read disturbance when the data stored therein is frequently accessed. In addition, electrical property of the non-volatile memory and the effect of continuous access of the non-volatile memory on electrical charge storage would induce data retention issues; that is, the data stored in the data block may be damaged. Therefore, to avoid the aforementioned problems, a data block must be refreshed; that is, the data block must move the data stored therein to a spare data block. However, if the data block could not be refreshed in time, the data stored in the data block may be incorrect and unrestorable.

SUMMARY OF THE INVENTION

One objective of the present invention is to provide a method for managing data block, a method for managing data and a data storage device capable of refreshing data blocks in time and thereby avoiding data damage.

The present invention provides a method for managing a plurality of data blocks of a data storage device. The method includes steps of: reading a plurality of data pages in the data blocks having valid data; updating a plurality of access counts of the data pages in the data blocks; determining whether an access count of the data block is greater than or equal to an access count threshold, wherein the access count of the data block is selected from one of the access counts of the data pages therein; and when the determination is positive, storing data in the data block into a spare data block of the data blocks. The access count threshold is updated when an erase count of the data block is determined to be greater than or equal to an erase count threshold.

The present invention further provides a method of data management for a data storage device. The method includes steps of: recording a plurality of access counts of a plurality of data pages in a plurality of data blocks in the data storage device; recording a plurality of erase counts of the data blocks; determining whether an access count of one of the data blocks is greater than or equal to an access count threshold, wherein the access count of the data block is selected from one of the access counts of the data pages therein; and when the determination is positive, performing a data moving procedure on the data block. The access count threshold is updated when an erase count is determined to be greater than or equal to an erase count threshold.

The present invention still further provides a method of data management for a data storage device. The method includes steps of: updating an access count of a data page if the data page is accessed; determining whether the access count of the data page is higher than or equal to an access count threshold; if the determination is positive, all of valid data in a data block including the data page is moved to a spare block; and defining the data block including the data page as another spare block. The page is accessed in order to response to a request from a host. The spare block is selected based on a wear leveling algorithm, and the access count threshold lowers with the increase in an erase count of the data block including the data page.

In summary, the present invention can dynamically adjust the access count threshold of a data block according to the erase count thereof, that is, adjust the access count threshold according to the status of use of the data block; therefore, the data block can be refreshed more accurately and consequently data damage or failure of data restore caused by failure of timely refresh of data blocks is avoided.

BRIEF DESCRIPTION OF THE DRAWINGS

Other advantages, objectives and features of the present invention will become apparent from the following description referring to the attached drawings.

FIG. 2B is a schematic illustration of a data block in accordance with an embodiment of the present invention.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
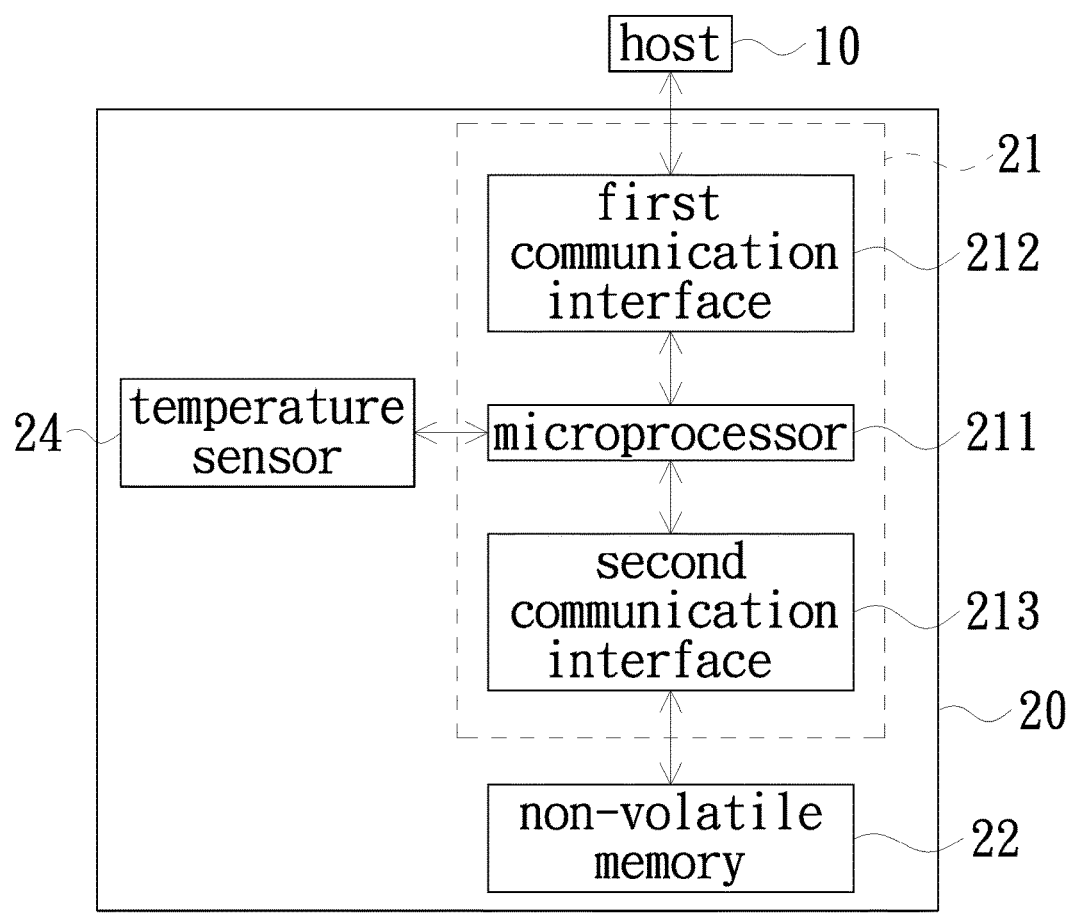
FIG. 1 is a schematic block view of a system in accordance with an embodiment of the present invention.

FIG. 1 is a schematic block view of a system in accordance with an embodiment of the present invention. As shown, the system of the present embodiment includes a host 10 and a data storage device 20. The host 10 is electrically coupled to the data storage device 20 and may be an electronic device such as a desktop or a tablet computer. The data storage device 20 is configured to receive a write instruction or a read instruction issued from the host 10, write received data into the data storage device 20 according to the write instruction, or read data stored in the data storage device 20 according to the read instruction. The data storage device 20 includes a memory controller 21 and a non-volatile memory 22. The non-volatile memory 12 is a data storage medium having relatively long data retention such as flash memory, magnetoresistive random access memory (Magnetoresistive RAM), ferroelectric RAM or phase-change memory.

The non-volatile memory 22 includes a plurality of cells (not shown), each of which is capable of recording data with at least one bit. Specifically, a single-level cell (SLC) can record one-bit data; a multi-level cell (MLC) can record two-bit data; a triple-level cell (TLC) can record three-bit data; however, the present invention is not limited thereto. For example, in one embodiment, the non-volatile memory 22 may include a plurality of single-level cells and a plurality of triple-level cells; wherein the data block constituted by the single-level cells is called a SLC data block and the data block constituted by the triple-level cells is called a TLC data block. In addition, a single-level cell may be simulated by a triple-level cell; that is, a triple-level cell may be switched to an operating mode of a single-level cell and configured to record one-bit data only. It is to be noted that although having a reduced data storage capacity, the triple-level cell switched to the operating mode of a single-level cell has higher data access speed. In addition, according to certain requirements, the users may switch a plurality of triple-level cells into to a plurality of multi-level cells or switch a plurality of multi-level cells into a plurality of single-level cells. In the following, a plurality of single-level cells and a plurality of triple-level cells will be taken as an example for describing the present invention, but the present invention is not limited thereto. In addition, it is to be understood that each data block includes a plurality of data pages.

The memory controller 21 is electrically coupled to the non-volatile memory 22 and configured to write data into or read data from the non-volatile memory 22 according to the write instruction or the read instruction, respectively. The memory controller 21 includes a microprocessor 211, a first communication interface 212 and a second communication interface 213. The microprocessor 211 is electrically coupled to the first communication interface 212 and the second communication interface 213. The first communication interface 212 is configured to receive the write instruction or the read instruction from the host 10. In one embodiment, the first communication interface 212 may be serial advanced technology attachment (SATA), small computer system interface (SCSI), universal serial bus (USB), peripheral component interconnect express (PCI Express), universal flash storage (UFS), embedded MultiMedia card (eMMC) or secure digital input/output (SDIO). The second communication interface 213 is electrically coupled to the non-volatile memory 22 and configured to communicate with the non-volatile memory 22 thereby accessing the non-volatile memory 22. In one embodiment, the second communication interface 213 may be open NAND flash interface (ONFI) or Toggle.

Figure 2A:
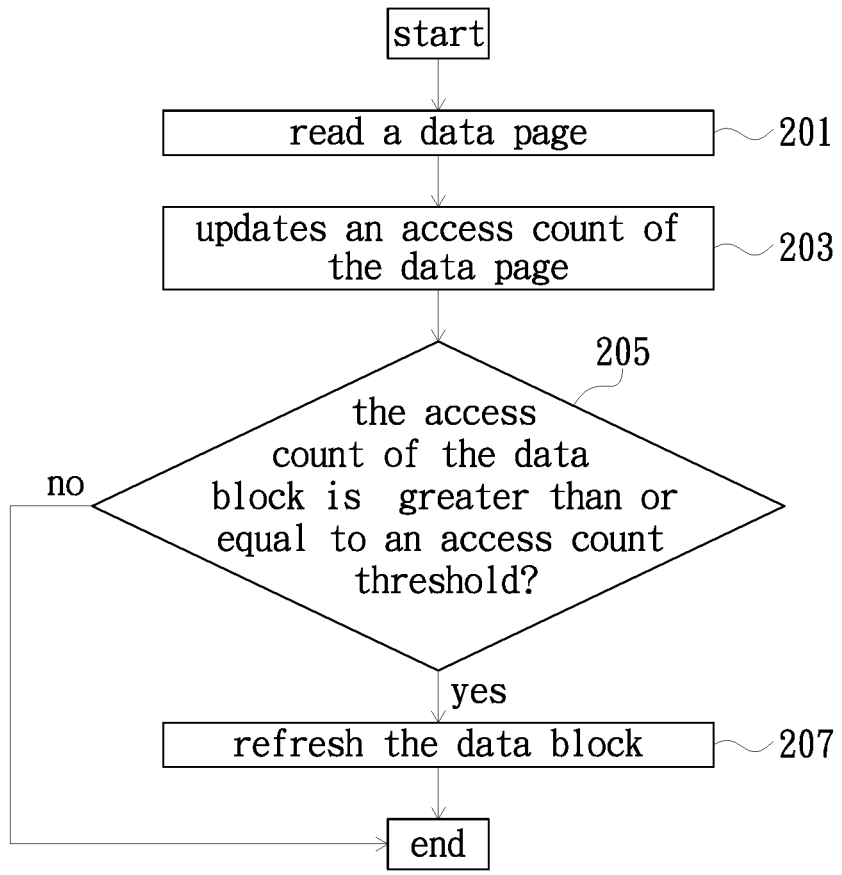
FIG. 2A is a flowchart of a method for managing data blocks in accordance with an embodiment of the present invention.

FIG. 2A is a flowchart of a method for managing data blocks in accordance with an embodiment of the present invention. Please refer to FIG. 1 and FIG. 2A together. First, in step 201, when the data storage device 20 receives a read instruction issued from the host 10, the microprocessor 211 reads at least one data page in the data block in the non-volatile memory 22 corresponding to the received read instruction via the second communication interface 213. Then, in step 203, the microprocessor 211 updates an access count of the read data page, such as incrementing the access count by one. In the present embodiment, a data page may include a data area and a spare area. In one embodiment, the data area includes a plurality of sectors for storing data and cyclic redundancy check (CRC); and the spare area is for storing additional data such as access count or metadata. Of course, CRC can be stored in the spare area, not the data area. It is a technical option and depends on a user's demand. In one embodiment, the user may use one specific data page in a data block to record the access counts of all the data pages in the same data block. In one embodiment, the user may use one specific data block to record the access counts of all the data pages of all the data blocks. In one embodiment, the user may use a build-in random access memory (RAM) of the host 10 or the data storage device 20 to record the access counts of all the data pages of all or in-use data blocks (that is, the data blocks stored with valid data) and to write the access counts into one specific data page in a respective data block at a proper time. In one embodiment, the user may write the access counts into specific data pages in a specific data block while the data storage device 20 is switched off or the electrical power is turned off. The principle of the above embodiment are identical or similar and the user can select any one embodiment from above to record the access counts of data pages; thus, no redundant detail is to be given in the following description.

Then, in step 205, the microprocessor 211 determines whether the access count of the data block (hereunder the data block 23 shown in FIG. 2B is taken as an example) is greater than or equal to an access count threshold. In one preferred embodiment, the access count of the data block 23 is defined as the largest access count among the access counts of the data pages in the data block 23. For example, as illustrated in FIG. 2B, the data block 23 includes data pages 231, 232, 233, 234 and 235. The data page 231 includes a plurality of data areas 231a (herein only two data areas 231a are exemplarily shown) and a spare area 231b for storing the respective access count; the data page 232 includes a plurality of data areas 232a (herein only two data areas 232a are exemplarily shown) and a spare area 232b for storing the respective access count; the data page 233 includes a plurality of data areas 233a (herein only two data areas 233a are exemplarily shown) and a spare area 233b for storing the respective access count; the data page 234 includes a plurality of data areas 234a (herein only two data areas 234a are exemplarily shown) and a spare area 234b for storing the respective access count; and the data page 235 includes a plurality of data areas 235a (herein only two data areas 235a are exemplarily shown) and a spare area 235b for storing the respective access count. In addition, the access count of the data page 231 recorded in the spare area 231b thereof is one; the access count of the data page 232 recorded in the spare area 232b thereof is 3; the access count of the data page 233 recorded in the spare area 233b thereof is 9; the access count of the data page 234 recorded in the spare area 234b thereof is 2; and the access count of the data page 235 recorded in the spare area 235b thereof is 7. Therefore, the access count of the data block 23 is defined as 9, which is the access count of the data page 233 having the largest access count in the data block 23. Then, when the determination obtained in step 205 is Yes (positive), step 207 is consequently performed. Alternatively, when the determination obtained in step 205 is No, the procedure of the method for managing data blocks of the present embodiment ends and waits for the next data read.

The access count of the data block 23 may be defined by other means. In one embodiment, for example, the access count of the data block 23 may be defined as to the smallest access count among the access counts of the data pages in the data block 23, the average value of the access counts of the data pages in the data block 23, or the access count of a specific data page (e.g., the first data page) in the data block 23.

As the access count of the data block 23 is determined to be greater than or equal to the access count threshold, which indicates that the data block 23 has been frequently accessed and consequently may have higher possibility of data damage, therefore in step 207, the microprocessor 211 refreshes the data block 23. Specifically, in one embodiment, the microprocessor 211 performs a data moving procedure to move or store the data in the data block 23 to a spare data block (that is, a data block without valid data). Then, the procedure of the method for managing data blocks of the present embodiment ends and waits for the next data read. In one embodiment, when the data in the data block 23 is moved or saved to a spare data block, the microprocessor 211 may further execute a garbage collection program to define the data block 23 from an in-use data block to a spare data block. In addition, the aforementioned spare data block for storing the data in the data block 23 may be selected based on a wear leveling algorithm. Further, it is to be understood that the spare data block is defined as an in-use data block once the spare data block is stored with valid data.

Further, in one preferred embodiment, the access count threshold may vary with the type of data block when the data storage device 20 includes various types of data blocks. For example, the access count threshold of a SLC data block is greater than or equal to that of a TLC data block; the access count threshold of a TLC data block switched from a SLC data block is greater than or equal to that of a native TLC data block; and the access count threshold of a data block in a word line open state (due to the data block is not filled with data) is less than or equal to that of a data block not in the word line open state. As the access count threshold may vary with the type of data block, it is to be noted that in step 205 the determination of whether the access count of a current data block is greater than or equal to an access count threshold performed by the microprocessor 211 is based on the type of the current data block. Further, to simplify the management of data blocks, it is to be understood that the user may set one access count threshold and apply the access count threshold to all different types of data blocks.

Figure 3:
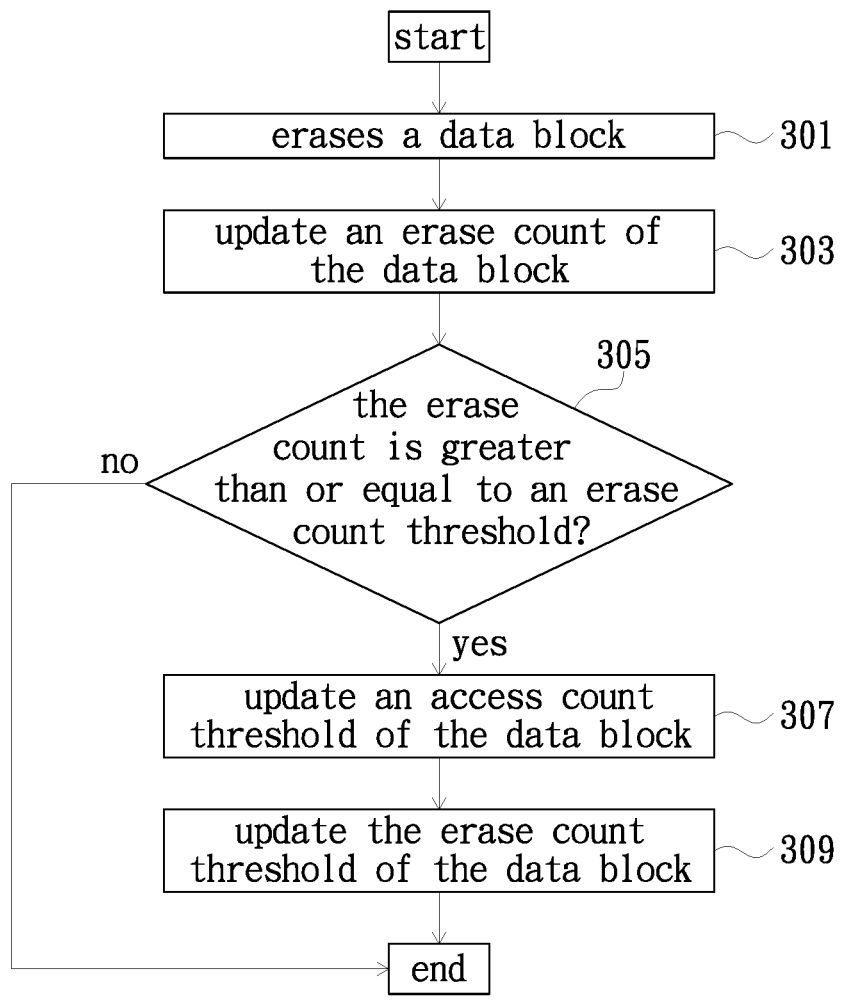
FIG. 3 is a flowchart of a method for adjusting access count threshold in accordance with an embodiment of the present invention.

FIG. 3 is a flowchart of a method for adjusting access count threshold in accordance with an embodiment of the present invention. Please refer to FIGS. 1, 2A and 3 together. First, in step 301, the microprocessor 211 erases all the data stored in the data block 23. In one embodiment, for example, the microprocessor 211 executes the garbage collection program to erase the data stored in the data block 23. Then in step 303, the microprocessor 211 updates an erase count of the data block 23. In one embodiment, for example, the microprocessor 211 updates the erase count of the data block 23 by incrementing the erase count by one. Then in step 305, the microprocessor 211 determines whether the erase count of the data block 23 is greater than or equal to an erase count threshold. When the determination obtained in step 305 is Yes, then consequently step 307 is performed. Alternatively, when the determination obtained in step 305 is No, the procedure of the method for adjusting an access count threshold of the present embodiment ends. Then in step 307, the microprocessor 211 updates the access count threshold of the data block 23; therefore the microprocessor 211 can perform the determination in step 205 as shown in FIG. 2A based on the updated access count threshold while performing the method for managing data blocks of the present invention. In step 309, the microprocessor 211 updates the erase count threshold of the data block 23. In the present embodiment, the updated erase count threshold and the updated access count threshold are negatively correlated; that is, the erase count threshold increases as the access count threshold decreases. The next time when the current erase count of the data block 23 is greater than or equal to the updated erase count threshold, the microprocessor 211 updates the access count threshold of the data block 23 in step 307 and updates the erase count threshold of the data block 23 in step 309 again.

The updates of the access count threshold and erase count threshold will be described in detail as follow. Herein the data block 23 being a SLC data block is taken as an example. Further, in this example, the data block 23 (e.g., a SLC data block) has an average erase endurance of, for example, 20,000 times, indicating that the data block 23 can be erased 20,000 times without significant data retention problem. Further, in this example, the data block 23 has a predetermined access count threshold of 1,000,000 and a predetermined (or initial) erase count of zero. With the increase in erase count, in one preferred embodiment the erase count threshold of the data block 23 is updated in a unit of 10% of the average erase endurance; that is, the data block 23 has one erase count threshold update every 2,000 (=20,000× 10%) erases. Therefore, the erase count threshold would be 2,000 after the first update; the erase count threshold would be 4,000 after the second update; likewise, the erase count threshold would be 18,000 after the ninth update. It is to be understood that aforementioned values/numbers are for exemplary purpose only, and the present invention is not limited thereto. Therefore, when the erase count is accumulated to 2,000 and accordingly in step 305 as shown in FIG. 3 the access count of the data block 23 is determined to be greater than or equal to the erase count threshold (e.g., 2,000), the microprocessor 211 performs step 307 for the first time to update the access count threshold by multiplying the current access count threshold (that is, the predetermined access count threshold) by a set ratio. In one preferred embodiment, the set ratio is obtained by subtracting the erase count from the average erase endurance and dividing the above difference by the average erase endurance (=(20, 000−2,000)/20,000), and is 90%. Therefore, after multiplied by 90%, the current access count threshold is updated to 90% of the prior access count threshold. Then in step 309, the microprocessor 211 updates the erase count threshold to 4,000. Accordingly, the next time when the erase count is greater than or equal to the updated erase count threshold, the current access count threshold is updated to 80% of the predetermined (or initial) access count threshold; and so on. Following is a lookup table of the erase count threshold, the access count threshold and the set ratio, wherein K represents a thousand times and M represents a million times in the table.

| Lookup Table | | | | | |
|---|---|---|---|---|---|
| Erase Count Threshold | 0 | 2K | 4K | . . . | 16K | 18K |
| Access Count Threshold | 1M | 0.9M | 0.8M | . . . | 0.2M | 0.1M |
| Set Ratio (%) | 100 | 90 | 80 | . . . | 20 | 10 |

Besides using a fixed value, the user may set the predetermined access count threshold by other means. For example, in one preferred embodiment, the predetermined access count threshold of a SLC data block is set to be the product of a first predetermined value and the number/quantity of the data pages in the SLC data block; the predetermined access count threshold of a TLC data block is set to be the product of a second predetermined value and the number/quantity of the data pages in the TLC data block; the predetermined access count threshold of a TLC data block in the word line open state is set to be the product of a third predetermined value and the number/quantity of the data pages in the TLC data block. Further, it is to be understood that the average erase endurance of a TLC data block is shorter than that of a SLC data block, and that a TLC data block in the word line open state is more vulnerable to read disturbance; therefore, the first determined value may be set to be greater than the second predetermined value, and the second determined value may be set to be greater than the third predetermined value. As a result, by setting the predetermined access count threshold according to the type of data block, the method for managing data block of the present invention can be executed more efficiently. In one embodiment, the first, second and third predetermined values may be the average erase endurances of different types of data blocks, but the present invention is not limited thereto. In addition, the aforementioned access count, access count threshold, predetermined access count threshold, erase count, erase count threshold and lookup table may be stored in at least one data page in the data block for storing important system data, such as at least one data page in a SLC data block.

In one embodiment, the set ratio may further include a temperature parameter. As shown in FIG. 1, the data storage device 20 may further include a temperature sensor 24 electrically coupled to the microprocessor 211. The temperature sensor 24 is configured to provide an environmental temperature value to the microprocessor 211 for calculating an average temperature. In one embodiment, the temperature parameter is obtained by subtracting the average temperature from a temperature range and dividing the above difference by the temperature range. For example, if the temperature range is 75 and the average temperature is 50 (that is, 50 degree Celsius), then the temperature parameter is 0.33 (=(75−50)/75). In the present embodiment, the set ratio is the product of the set ratio of the previous embodiment and the temperature parameter. Thus, by introducing the temperature parameter, the method for managing data block of the present embodiment is more suited for actual demands.

The aforementioned lookup table can be established according to the aforementioned steps and used as a reference of access count threshold in step 205. Therefore, execution of the method for adjusting access count threshold of the present invention by the microprocessor 211 may be omitted, thereby providing an improved performance.

In summary, data retention problem would become more significant with the increase in erase count. Therefore, the method for managing data block and method for managing data of the present invention can dynamically adjust the access count threshold of the data block according to the erase count thereof so as to refresh the erase count of the data block in time. As a result, data retention problem and data damage resulted from read disturbance or low erase endurance are avoided.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method for managing a plurality of data blocks of a data storage device, comprising steps of:
   reading a plurality of data pages in the data blocks having valid data;
   updating a plurality of access counts of the data pages in the data blocks;
   determining whether an access count of the data block is greater than or equal to an access count threshold, wherein the access count of the data block is selected from one of the access counts of the data pages therein; and
   when the determination is positive, storing data in the data block into a spare data block of the data blocks,
   wherein the access count threshold and an erase count threshold are respectively updated when an erase count of the data block is determined to be greater than or equal to the erase count threshold, and the updated erase count threshold and the updated access count threshold are negatively correlated.

2. The method for managing a plurality of data blocks of a data storage device according to claim 1, wherein the access count threshold is updated by performing steps of:
   erasing the data block;
   updating the erase count of the data block;
   determining whether the erase count of the data block is greater than or equal to the erase count threshold; and
   when the determination is positive, updating the access count threshold of the data block according to the erase count.

3. The method for managing a plurality of data blocks of a data storage device according to claim 1, wherein the access count of the data block is equal to a largest access count among the access counts of the data pages in the data block.

4. The method for managing a plurality of data blocks of a data storage device according to claim 1, wherein the access count threshold is updated by performing a step of:
   lowering the access count threshold when the erase count of the data block is determined to be greater than or equal to the erase count threshold.

5. The method for managing a plurality of data blocks of a data storage device according to claim 1, wherein the access count threshold is updated by performing a step of:
   updating the access count threshold according to a set ratio when the erase count of the data block is determined to be greater than or equal to the erase count threshold.

6. The method for managing a plurality of data blocks of a data storage device according to claim 1, wherein the access count threshold is updated by performing a step of:
   updating the access count threshold according to a set ratio and a temperature parameter when the erase count of the data block is determined to be greater than or equal to the erase count threshold.

7. A method of data management for a data storage device, comprising steps of:
   recording a plurality of access counts of a plurality of data pages in a plurality of data blocks in the data storage device;
   recording a plurality of erase counts of the data blocks;
   determining whether an access count of one of the data blocks is greater than or equal to an access count threshold, wherein the access count of the data block is selected from one of the access counts of the data pages therein; and
   when the determination is positive, performing a data moving procedure on the data block,
   wherein the access count threshold and an erase count threshold are respectively updated when an erase count is determined to be greater than or equal to the erase count threshold, and the updated erase count threshold and the updated access count threshold are negatively correlated.

8. The method of data management for a data storage device according to claim 7, wherein when the determination is positive, the access count threshold is updated by performing steps of:
- updating the erase count when the data moving procedure is completed;
- determining whether the erase count of the data block is greater than or equal to the erase count threshold; and
- when the erase count of the data block is determined to be greater than or equal to the erase count threshold, updating the access count threshold according to the erase count.

9. The method of data management for a data storage device according to claim 7, wherein the access count of the data block is equal to a largest access count among the access counts of the data pages in the data block.

10. The method of data management for a data storage device according to claim 8, wherein the access count threshold is updated by performing a step of:
- lowering the access count threshold according to the erase count.

11. The method of data management for a data storage device according to claim 9, wherein the access count threshold is updated by performing a step of:
- updating the access count threshold according to a set ratio when the erase count of the data block is determined to be greater than or equal to the erase count threshold.

12. The method of data management for a data. storage device according to claim 7, wherein the access count threshold is updated by performing a step of:
- updating the access count threshold according to a set ratio and a temperature parameter when the erase count of the data block is determined to be greater than or equal to the erase count threshold.

13. A method management for a data storage device, comprising steps of
- updating an access count of a data page if the data page is accessed;
- determining whether the access count of the data page is higher than or equal to an access count threshold;
- if the determination is positive, all of valid data in a data block including the data page is moved to a spare block; and
- defining the data block including the data page as another spare block, wherein the page is accessed in order to response to a request from a host, the spare block is selected based on a wear leveling algorithm, the access count threshold and an erase count threshold are respectively updated when an erase count of the data block is determined to be greater than or equal to the erase count threshold, and the updated erase count threshold and the updated access count threshold are negatively correlated.

* * * * *